United States Patent
Trivedi

(10) Patent No.: US 9,813,073 B1
(45) Date of Patent: Nov. 7, 2017

(54) SUB-RANGING SAR ANALOG-TO-DIGITAL CONVERTER WITH META-STABILITY DETECTION AND CORRECTION CIRCUITRY

(71) Applicant: NXP B.V., Eindhoven (NL)

(72) Inventor: Ronak Prakashchandra Trivedi, Bangalore (IN)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/683,748

(22) Filed: Aug. 22, 2017

(51) Int. Cl.
| | | |
|---|---|---|
| *H03M 3/00* | (2006.01) | |
| *H03M 1/10* | (2006.01) | |
| *H03M 1/12* | (2006.01) | |
| *H03M 1/06* | (2006.01) | |
| *H03M 1/00* | (2006.01) | |
| *H03M 1/80* | (2006.01) | |

(52) U.S. Cl.
CPC ....... *H03M 1/1009* (2013.01); *H03M 1/1071* (2013.01); *H03M 1/00* (2013.01); *H03M 1/0695* (2013.01); *H03M 1/12* (2013.01); *H03M 1/804* (2013.01); *H03M 3/30* (2013.01)

(58) Field of Classification Search
CPC ............ H03M 3/30; H03M 1/00; H03M 1/12; H03M 1/0695; H03M 1/804
USPC .......................... 341/143, 118, 161, 155, 172
See application file for complete search history.

(56) References Cited

U.S. PATENT DOCUMENTS

| | | | |
|---|---|---|---|
| 8,482,449 B1 * | 7/2013 | Zabroda | H03M 1/0863 341/118 |
| 8,872,691 B1 | 10/2014 | Stepavovic | |
| 8,957,802 B1 | 2/2015 | Evans | |
| 2012/0146822 A1 | 6/2012 | Kang | |

OTHER PUBLICATIONS

Y.Z. Lin et al., "A 9-Bit 150-MS/s Subrange ADC Based on SAR Architecture in 90-nm CMOS," IEEE Transactions on Circuits and Systems-1: Regular Papers, vol. 60, No. 3, Mar. 2013

* cited by examiner

*Primary Examiner* — Joseph Lauture
(74) *Attorney, Agent, or Firm* — Charles E. Bergere

(57) ABSTRACT

A sub-ranging SAR ADC has a coarse flash ADC that generates bit values corresponding to MSBs of the digital output value, and a fine SAR ADC that generates bit values corresponding to LSBs of the digital output value. The fine ADC generates successive analog approximation signals for the analog input signal. Meta-stability (MTS) detection circuitry detects a coarse-ADC MTS condition in the coarse ADC if a magnitude of a difference between a current approximation signal and a previous approximation signal is greater than a specified threshold level. A controller controls operations of the sub-ranging ADC to correct for a detected coarse-ADC MTS condition. The MTS detection circuitry includes a positive MTS detector that detects a positive coarse-ADC MTS condition in the coarse ADC and a negative MTS detector that detects a negative coarse-ADC MTS condition in the coarse ADC.

10 Claims, 5 Drawing Sheets

100

132

136

138

SUB-RANGING SAR ANALOG-TO-DIGITAL CONVERTER WITH META-STABILITY DETECTION AND CORRECTION CIRCUITRY

BACKGROUND

The present invention relates to analog-to-digital converters (ADCs) and, more particularly, to sub-ranging successive approximation register (SAR) ADCs that combine a coarse flash ADC for the most-significant bits (MSBs) of the digital output and a fine SAR ADC for the least-significant bits (LSBs) of the digital output.

A multi-bit ADC generates a multi-bit digital output signal that corresponds to an applied analog input signal. A SAR ADC is a particular type of ADC that successively generates the digital output signal one bit at a time from the MSB down to the LSB. At each successive approximation, the SAR ADC uses a digital-to-analog converter (DAC) to generate a current intermediate analog approximation signal using the previously determined bits and a value of 1 for the current bit being resolved (with the rest of the bits set to 0), where the current approximation signal is compared to the analog input signal to determine whether the current bit should be a 1 or a 0. If the current approximation signal is greater than the analog input signal, then the current bit being resolved should be a 0; otherwise, the current bit being resolved should be a 1. U.S. Patent Application Publication No. 2012/0146822 A1, the teachings of which are incorporated herein by reference in their entirety, describes such a SAR ADC.

Y. Z. Lin et al., "A 9-Bit 150-MS/s Subrange ADC Based on SAR Architecture in 90-nm CMOS," IEEE Transactions on Circuits and Systems-1: Regular Papers, Vol. 60, No. 3, March 2013, the teachings of which are incorporated herein by reference in their entirety, describe a 9-bit sub-ranging SAR ADC that combines a 3.5-bit coarse flash ADC and a 6-bit fine SAR ADC. The 3.5-bit flash ADC uses a "thermometer"-type resistor ladder to generate, in a single conversion step, a 14-bit thermometer value and a corresponding 4-bit binary value corresponding to the MSBs of the 9-bit digital output. The 4-bit value is then applied to a differential segmented capacitive DAC to generate an analog residue signal that is applied as the initial approximation signal to the 6-bit SAR ADC, which successively generates the bits of a 6-bit value corresponding to the LSBs of the 9-bit digital output, where the 4-bit value from the flash ADC overlaps the 6-bit value from the SAR ADC by one bit. These two digital values are then combined to form the 9-bit digital output value.

It is known in the art of SAR ADCs that a meta-stability condition can exist when the current approximation signal is sufficiently close to the analog input signal. In that case, the SAR ADC may mistakenly determine that the current bit has a value of 1, when it should have a value of 0, or vice versa. U.S. Pat. Nos. 8,482,449 B1; 8,872,691 B1; and 8,957,802 B1, the teachings of all of which are incorporated herein by reference in their entirety, describe techniques for detecting and correcting meta-stability conditions in SAR ADCs.

In a sub-ranging SAR ADC, such as the sub-ranging SAR ADC described by Y. Z. Lin et al., it is also possible for a meta-stability condition to exist in the coarse flash ADC. In particular, if the analog input signal is sufficiently close to one of the reference voltages generated by the resistor ladder of the flash ADC, then a meta-stability condition can exist in the coarse flash ADC, where the LSB of the multi-bit binary value generated by the flash ADC will have the wrong value. For the 9-bit sub-ranging SAR ADC of Y. Z. Lin et al., such a meta-stability condition could cause one of the 14 thermometric output bits generated by the resistor ladder of the 3.5-bit flash ADC to have an undetermined voltage level which may be neither logic level 0 nor logic level 1.

It would be advantageous to be able to detect and correct meta-stability conditions in a flash ADC of a sub-ranging SAR ADC.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
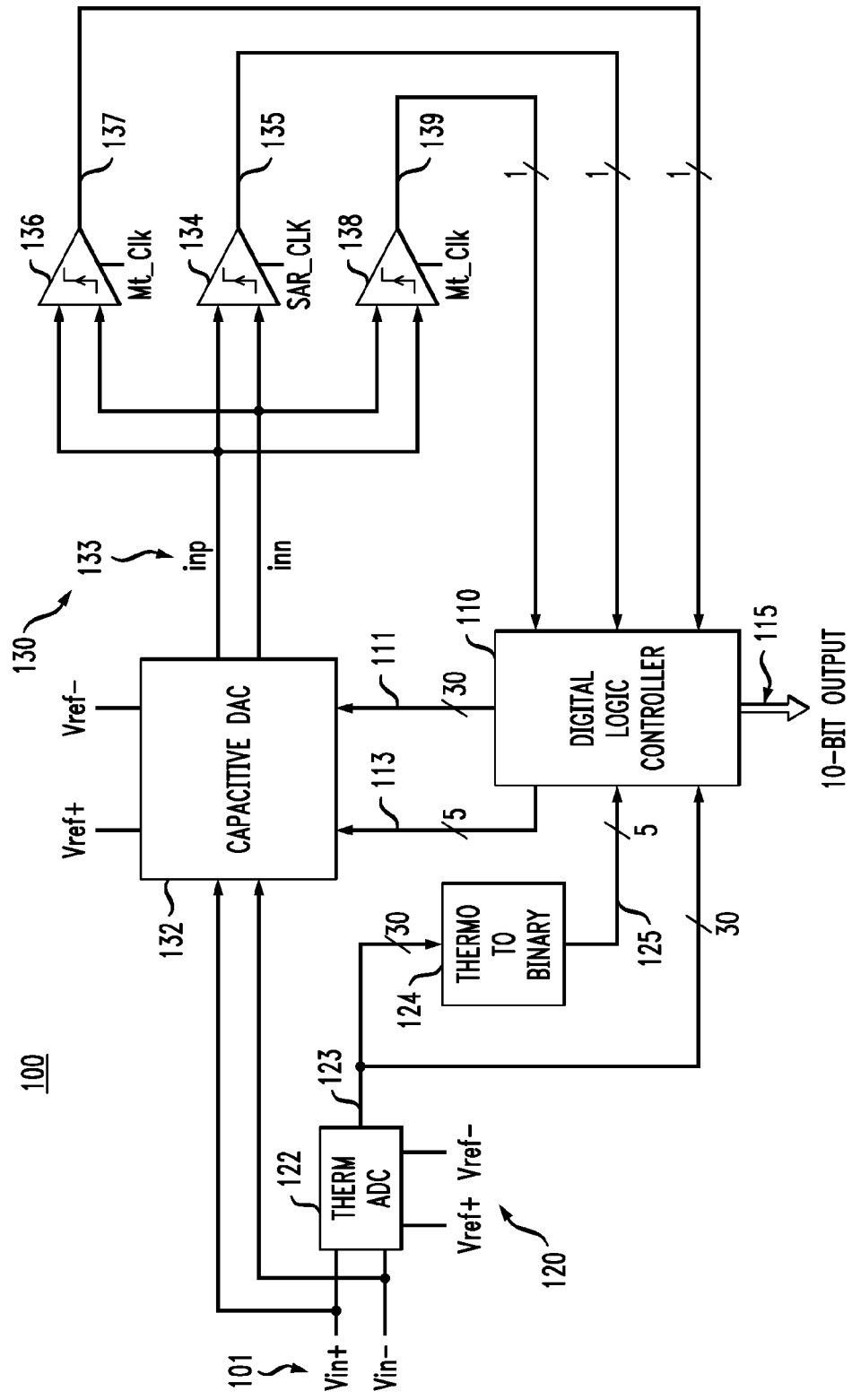
FIG. 1 is a high-level block diagram of a 10-bit sub-ranging SAR ADC according to one embodiment of the invention.

FIG. 1 is a high-level block diagram of a 10-bit sub-ranging SAR ADC 100 according to one embodiment of the invention. The sub-ranging SAR ADC 100 converts a differential analog input signal 101 (consisting of the positive and negative component signals Vin+ and Vin−) into a 10-bit binary output signal 115. In this particular embodiment, the sub-ranging SAR ADC 100, which is controlled by a digital logic controller 110, has (i) a conventional 4.5-bit coarse flash ADC 120 that generates, in a single conversion step, a 30-bit "thermometer"-type digital value 123 and a corresponding 5-bit binary value 125 that corresponds to the MSBs of the digital output signal 115 and (ii) a conventional 6-bit fine SAR ADC 130 that then successively generates a six-bit binary SAR value one bit at a time over a number of different phases of SAR conversion, where the 5-bit MSB value 125 from the flash ADC 120 overlaps the 6-bit LSB value from the SAR ADC 130 by one bit.

The coarse flash ADC 120 comprises (i) a conventional "thermometer"-type ADC 122 that converts the input signal 101 into the 30-bit thermometer value 123 and (ii) a conventional thermometer-to-binary converter 124 that converts the 30-bit thermometer value 123 into the corresponding 5-bit binary value 125. The 30-bit thermometer value 123 and the corresponding 5-bit binary value 125 are both provided to the controller 110.

The fine SAR ADC 130 comprises a capacitive DAC 132 and a conventional SAR comparator 134. At each phase of SAR conversion, the capacitive DAC 132 (a) receives from the controller 110 (i) a 30-bit thermometer value 111 and (ii) a 5-bit binary value 113 corresponding to the five MSBs of the 6-bit binary SAR value and (b) generates a current analog differential approximation signal 133 (consisting of the positive and negative component signals inp and inn). Depending on the implementation, the capacitive DAC 132 may be a split-capacitor DAC or any other suitable capacitive DAC.

Until a meta-stability condition is detected in the coarse flash ADC 120, the 30-bit thermometer value 111 applied to the capacitive DAC 132 will be identical to the 30-bit thermometer value 123 generated by the thermometer ADC 122. As described further below, if and when such a meta-stability condition is detected, the controller 110 will generate the 30-bit thermometer value 111 by flipping one bit of the 30-bit thermometer value 123.

The 5-bit binary value 113 consists of zero, one, or more bits that have already been resolved by the fine SAR ADC 130 during zero, one, or more previous SAR phases plus the bit being resolved during the current SAR phase (temporarily set to 1) plus zero, one, or more bits to be resolved during subsequent SAR phases (all temporarily set to 0). The current approximation signal 133 represents the current approximation of the input signal 101.

The SAR comparator 134 compares the current approximation signal 133 to the input signal 101 to generate a binary comparator output value 135 that indicates to the controller 110 whether or not the current approximation signal 133 is smaller than the input signal 101. If the current approximation signal 133 is smaller than the input signal 101, then the controller 110 determines that the current bit should remain set to 1 for the next SAR phase. Otherwise, the controller 110 determines that the current bit should be set to 0 for the next SAR phase.

Figure 2:
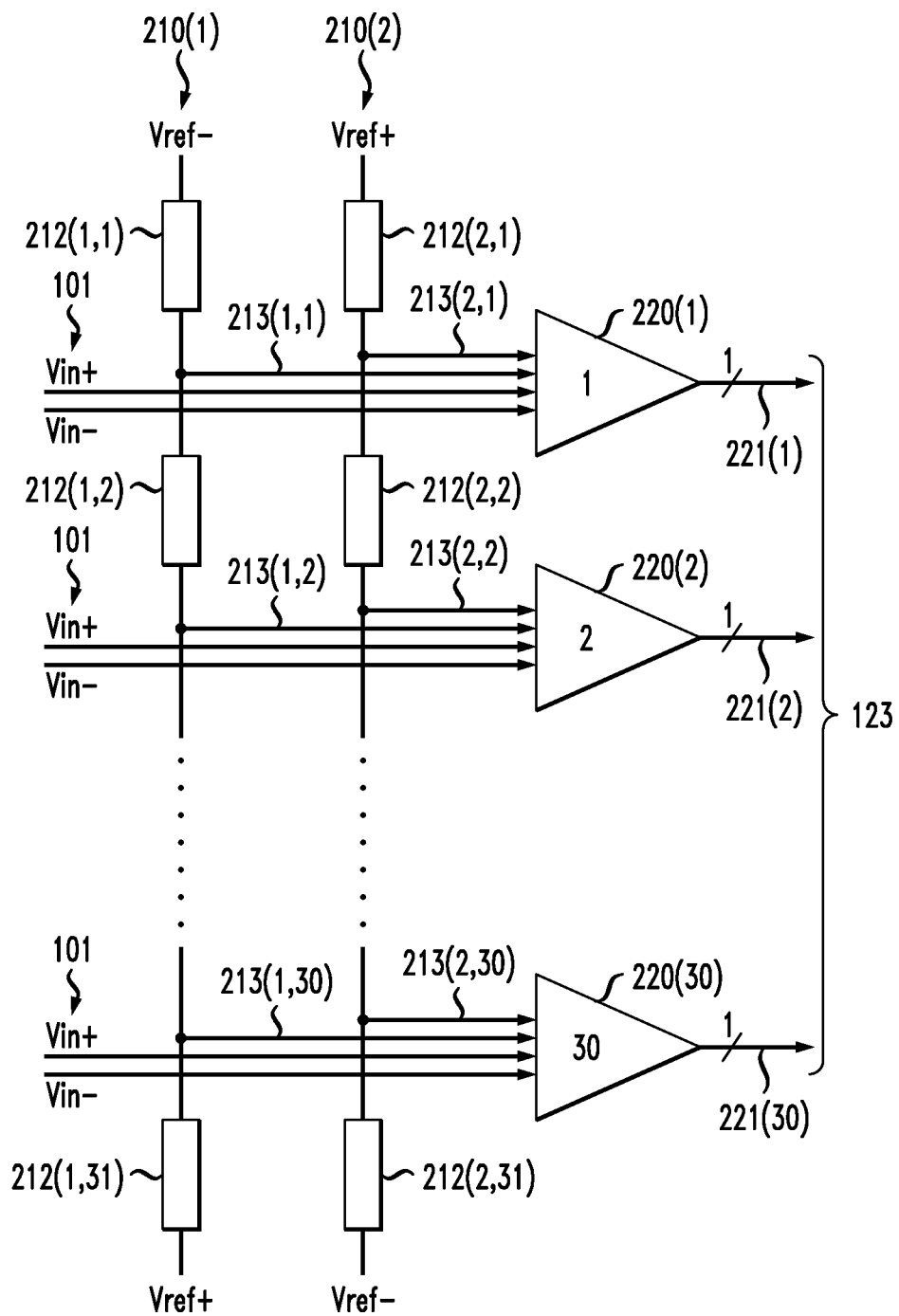
FIG. 2 is a high-level schematic block diagram of the thermometer-type ADC of FIG. 1.

FIG. 2 is a high-level schematic block diagram of the thermometer-type ADC 122 of FIG. 1. The thermometer ADC 122 comprises two oppositely-poled resistor ladders 210(1) and 210(2), where each resistor ladder 210(i) consists of 31 resistors 212(i,1)-212(i,31) connected in series between positive and negative reference voltages Vref+ and Vref−. The thermometer ADC 122 also has 30 comparators 220(1)-220(30), where each comparator 220(i) receives two complementary reference signals 213(1,i) and 213(2,i) tapped from the resistor ladders 210(1) and 210(2) and compares those two reference signals 213(1,i) and 213(2,i) to the input component signals Vin+ and Vin−.

According to one possible design for the comparators 220, if the input signals Vin+ and Vin− are greater than the reference signals 213(1,i) and 213(2,i), then the corresponding comparator 220(i) generates a 1-bit binary comparator output value 221(i) of 1. Otherwise, the comparator 220(i) generates the comparator output value 221(i) to be 0. The 30 comparator output values 221(1)-221(30) form the bits of the 30-bit thermometer value 123 of FIG. 1. According to this implementation, all of the comparator output bits 221(i) corresponding to differential reference signals 213(i) (consisting of signals 213(1,i) and 213(2,i)) that are smaller than the input signal 101 will be 1, while all of the other comparator output bits 221(i) will be 0. In this way, the 30-bit thermometer value 123 identifies the magnitude of the input signal 101 to within the resolution of the thermometer ADC 122.

Ideally, the thermometer ADC 122 always outputs the same 30-bit thermometer value 123 throughout the SAR conversion stage. In that case, the 30-bit thermometer value 111 that is applied to the capacitive DAC 132 of FIG. 1 will remain equal to that same 30-bit value 123 throughout the SAR conversion stage. In that case, the approximation signal 133 for the SAR conversion stage is guaranteed to be at most a known voltage magnitude away from the input signal 101 throughout the SAR conversion stage, where that known voltage magnitude depends on the design of the resistor ladders 210 in the thermometer ADC 122.

If, however, the input signal 101 is sufficiently close to one of the differential reference signals 213(i), then the corresponding comparator 220(i) might take a relatively long time to determine whether the input signal 101 is greater than or less than the reference signal 213(i). In that case, the corresponding comparator output signal 221(i) may flip from 1 to 0, or vice versa, at some unpredictable point in time during the SAR conversion stage, thereby changing the 30-bit thermometer value 123 and therefore the 30-bit thermometer value 111 as well during the SAR conversion stage. Moreover, if the signals are especially close, then the comparator output signal 221(i) could flip back and forth multiple times during the SAR conversion stage. These occurrences represent the existence of a meta-stability condition in the coarse flash ADC 120 of FIG. 1.

In that case, the approximation signal 133 generated by the capacitive DAC 132 will change during the course of the SAR conversion stage such that the voltage difference between the approximation signal 133 and the input signal 101 can have a magnitude that is greater than the expected magnitude predicted by the design of the thermometer ADC 122. Moreover, depending on whether the meta-stability condition resulted in the comparator output bit 221 being a 1 instead of a 0 or a 0 instead of a 1, that voltage difference can be positive or negative.

Due to the possibility of an unknown voltage offset between the coarse flash ADC 120 and the fine SAR ADC 130, simply measuring the magnitude of the voltage difference between the approximation signal 133 and the input signal 101 might result in either a false positive detection or a false negative detection of a meta-stability condition in the coarse flash ADC 120.

Instead, the present invention detects the existence of a meta-stability condition in the coarse flash ADC 120 based on the magnitude of the change in the approximation signal 133 between successive phases of SAR operation being greater than the expected maximum change according to the design of the thermometer ADC 122.

In order to detect the existence of a coarse ADC meta-stability condition, the sub-ranging SAR ADC 100 of FIG. 1 includes a positive meta-stability (PM) detector 136 and a negative meta-stability (NM) detector 138, which together can detect both positive and negative meta-stability conditions in the coarse flash ADC 120.

The PM detector 136 detects whether the current approximation signal 133 is greater than the previous approximation signal 133 by more than a specified voltage threshold level corresponding to the maximum expected voltage change between successive SAR phases. If so, then the PM detector 136 generates a high value for the PM output signal 137 indicating the existence of a positive meta-stability condition in the coarse flash ADC 120; otherwise, the PM output signal 137 is low.

Similarly, the NM detector 138 detects whether the current approximation signal 133 is less than the previous approximation signal 133 by more than the specified voltage threshold level. If so, then the NM detector 138 generates a high value for the NM output signal 139 indicating the existence of a negative meta-stability condition in the coarse flash ADC 120; otherwise, the NM output signal 139 is low.

The PM output signal 137 and the NM output signal 139 are both applied to the controller 110 along with the SAR comparator output 135. The controller 110 uses these values to control the capacitive DAC 132 as described below.

If either of the PM output signal 137 or the NM output signal 139 is high, then the controller 110 will correct for the meta-stability condition by flipping the value of the LSB in the current 5-bit binary value 125 received from the thermometer-to-binary converter 124. In particular, when a meta-stability condition occurs, the LSB of the 5-bit binary value 125 changes from 1 to 0 or from 0 to 1. The controller 110 then corrects the LSB by flipping its value. In other words, the controller 110 returns the 5-bit binary value 125 back to the same value it had before the meta-stability condition occurred.

In addition, if the PM output signal 137 is high, indicating the detection of a PM condition, then the controller 110 (i) switches the bottom plate of the bottom-most capacitor (which is controlled by the t1 bit line of FIG. 3) in the capacitive DAC 132 to an appropriate negative reference in order to reduce the DAC output and then (ii) repeats the SAR phase for most recently resolved bit. If, on the other hand, the NM output signal 139 is high, indicating the detection of an NM condition, then the controller 110 (i) switches the bottom plate of the top-most capacitor (which is controlled by the t30 bit line of FIG. 3) in the capacitive DAC 132 to an appropriate positive reference in order to increase the DAC output and then (ii) repeats the SAR phase for most recently resolved bit.

Figure 3:
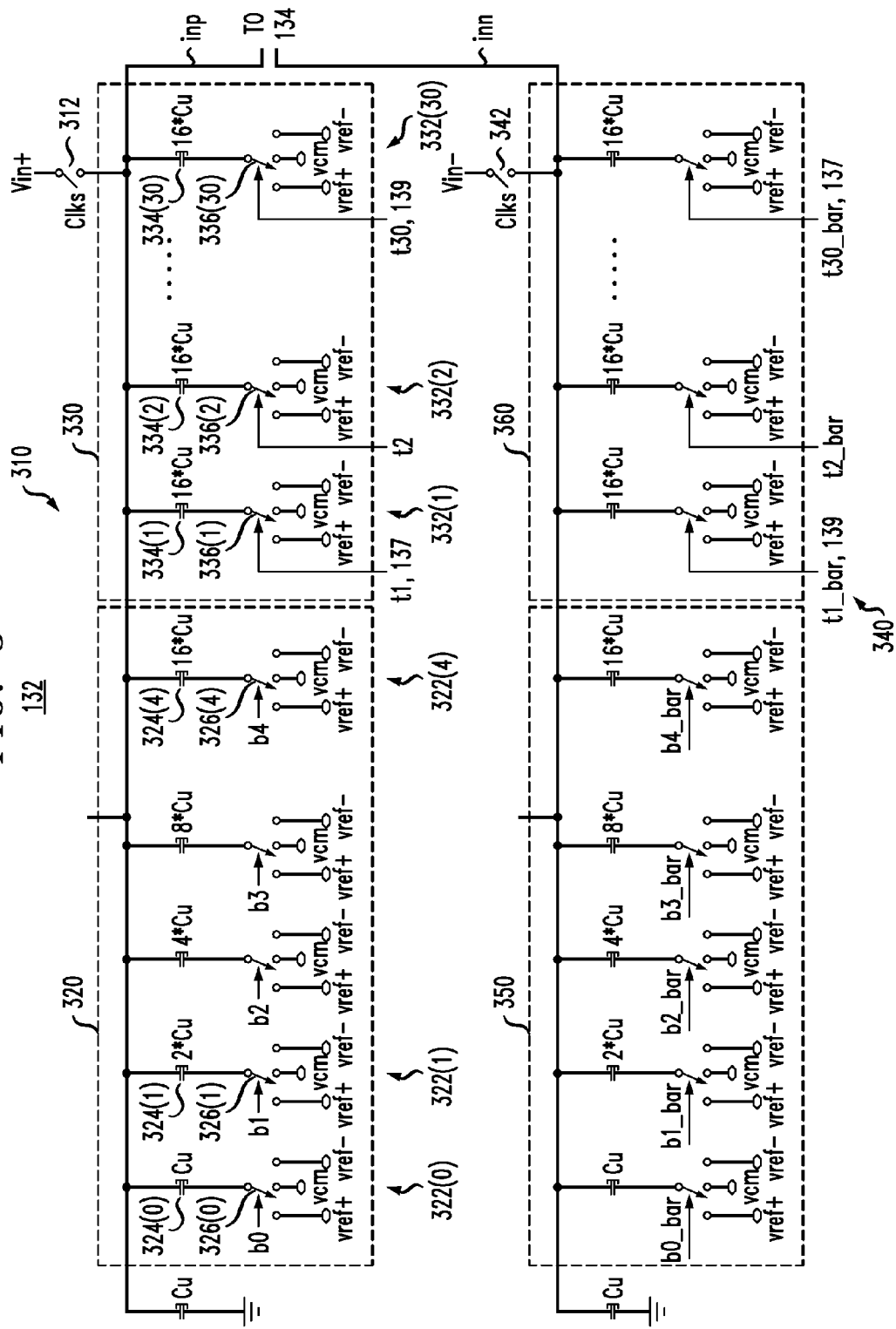
FIG. 3 is a schematic diagram of the capacitive DAC of FIG. 1.

FIG. 3 is a schematic diagram of the capacitive DAC 132 of FIG. 1, according to one possible implementation of the invention. As shown in FIG. 3, the capacitive DAC 132 has (i) a positive capacitor array 310 that generates the positive component inp of the approximation signal 133 and (ii) a negative capacitor array 340 that generates the negative component inn of the approximation signal 133. The positive capacitor array 310 has a fine binary capacitor sub-array 320 and a coarse thermometer capacitor sub-array 330. Similarly, the negative capacitor array 340 has a fine binary capacitor sub-array 350 and a coarse thermometer capacitor sub-array 360.

The fine binary capacitor sub-array 320 has five switched capacitor legs 322(0)-322(4), where each capacitor leg 322(i) has (1) a capacitor 324(i) having a capacitance equal to ($2^i$*Cu), where Cu is the base capacitance for the capacitive DAC 132, and (2) a switch 326(i) that is controlled by a one-bit control signal bi, where b4 is the MSB of the five-bit binary value 113 of FIG. 1, b3 is the second MSB of the binary value 113, and so on such that b0 is the LSB of the binary value 113. Note that the LSB of the 5-bit binary value 113 is the second LSB of the 6-bit binary SAR value generated by the SAR ADC 130. As explained later, the LSB of the 6-bit binary SAR value is resolved by the SAR ADC 130, but is never applied to the capacitive DAC 132.

During the coarse flash conversion stage (i.e., prior to time t1 in FIG. 4), each switch 326(i) is set to connect the bottom plate of the corresponding capacitor 324(i) to the common-mode voltage Vcm. During the fine SAR conversion stage (i.e., after time t1 in FIG. 4), each switch 326(i) is set to connect the bottom plate of the corresponding capacitor 324(i) to (i) the negative reference voltage Vref−, if the corresponding control signal bi is 0, and to (ii) the positive reference voltage Vref+, if the corresponding control signal bi is 1.

The coarse thermometer capacitor sub-array 330 has 30 switched capacitor legs 332(1)-332(30), where each capacitor leg 332(j) has (1) a capacitor 334(j) having a capacitance equal to (16*Cu) and (2) a switch 336(j). The $1^{st}$ switch 336(1) is controlled by the $1^{st}$ bit t1 of the 30-bit thermometer value 111 of FIG. 1 (i.e., bit 221(1) of FIG. 2) and by the NM output signal 139. The $30^{th}$ switch 336(30) is controlled by the $30^{th}$ bit t30 of the thermometer value 111 (i.e., bit 221(30) of FIG. 2) and by the PM output signal 137. For j=2, . . . , 29, the $j^{th}$ switch 336(j) is controlled by the $j^{th}$ bit tj of the thermometer value 111 (i.e., bit 221(j) of FIG. 2).

During the coarse flash conversion stage, each switch 336(j) is set to connect the bottom plate of the corresponding capacitor 334(j) to the common-mode voltage Vcm. During the fine SAR conversion stage, each switch 336(j) is initially set to connect the bottom plate of the corresponding capacitor 334(j) to (i) the negative reference voltage Vref−, if the corresponding control signal tj is 0, and to (ii) the positive reference voltage Vref+, if the corresponding control signal tj is 1.

A sufficiently large negative jump in the DAC output 133 from the previous SAR phase causes the NM output signal 139 to go high, indicating the detection of a negative meta-stability condition in the coarse flash converter 120. To correct for this NM condition, the controller 110 switches the t30 bit line to the positive reference voltage Vref+.

Similarly, a sufficiently large positive jump in the DAC output 133 from the previous SAR phase causes the PM output signal 137 to go high, indicating the detection of a positive meta-stability condition in the coarse flash converter 120. To correct for this PM condition, the controller 110 switches the t1 bit line to the negative reference voltage Vref−.

The fine binary capacitor sub-array 350 and the coarse thermometer capacitor sub-array 360 of the negative capacitor array 340 have analogous structures and operate in analogous manners as the fine binary capacitor sub-array 320 and the coarse thermometer capacitor sub-array 330 of the positive capacitor array 310, respectively, except that the switches are controlled based on the complements of the control signals bi and tj. If bi is 1, then its complement is 0, and vice versa.

The capacitive DAC 132 also has top-plate switches 312 and 342 respectively connected between Vin+ and Vin− and the top plates of the corresponding capacitors. The top-plate switches 312 and 342 are closed during the sampling phase (prior to time t0 in FIG. 4) and open during the coarse flash conversion stage and the fine SAR conversion stage.

Note that, although not described any further in this specification, the controller 110 may be designed to implement a suitable meta-stability detection and correction technique for detecting and correcting meta-stability in the fine SAR ADC 130, such as one of those techniques described in the cited prior-art references.

Figure 4:
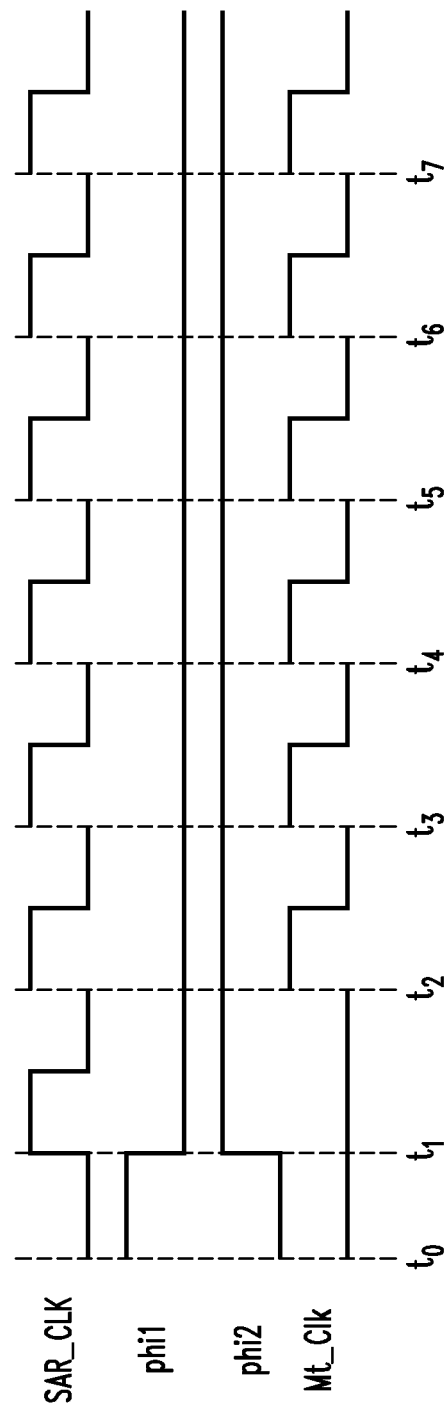
FIG. 4 is a timing diagram representing the different operations of the sub-ranging SAR ADC of FIG. 1.

FIG. 4 is a timing diagram representing the different operations of the sub-ranging SAR ADC 100 of FIG. 1. The time period from time t0 to time t1 represents the coarse stage of operation during which the coarse flash ADC 120 generates the 30-bit thermometer value 123 and the 5-bit binary value 125. The time period after time t1 represents the fine stage of operation during which the fine SAR ADC 130 generates the 6-bit binary SAR value one bit at a time.

From time t0 to time t1, the control signal phi1 is high, and the control signal phi2, the SAR clock SAR_CLK, and the meta-stability detection clock Mt_Clk are all low. Note that, during this time period, the controller 110 applies the 30-bit thermometer value 123 from the thermometer ADC 122 as the 30-bit thermometer value 111 to the capacitive DAC 132, such that, by time t1, the initial approximation signal 133 will be based on the current 30-bit thermometer value 123. Prior to time t1, the bottom plates of the capacitors 334(1)-334(30) of FIG. 3 are still connected to the common-mode voltage vcm. This means that the SAR comparator 134 will be ready to resolve the first bit of the 5-bit binary value 113 as soon as the first leading edge of the SAR_CLK is applied to the SAR comparator 134 at time t1.

At time t1, the coarse stage of conversion by the coarse flash ADC 120 is ended, and the fine stage of conversion by the fine SAR ADC 130 is begun. At time t1, the control signal phi1 is driven low, the control signal phi2 is driven high, and the SAR_CLK is initiated with its first leading edge, which triggers the comparator 134 to resolve the MSB of the 6-bit binary SAR value.

During the time period from time t1 to time t2, the controller 110 determines, based on the value of the SAR comparator output signal 135, whether the first bit of the 5-bit binary value 113 should remain set to 1 or be changed to 0. After making that determination and, if appropriate, that bit change, the controller 110 sets the second bit of the 5-bit binary value 113 to 1 to cause the capacitive DAC 132 to generate a new approximation signal 133.

At time t2, the second leading edge of the SAR_CLK triggers the comparator 134 to resolve the second MSB of the 5-bit binary value 113. At the same time, the first leading edge of Mt_Clk is applied to trigger both the PM detector 136 and the NM detector 138. If either of the corresponding detector output signals 137 and 139 is high, then the controller 110 determines that a coarse ADC meta-stability condition exists, makes an appropriate correction by changing the reference voltage applied to the bottom plate of the appropriate capacitor of capacitive DAC, and repeats the resolution of the most-recent SAR bit using the resulting updated approximation signal 133. If neither detector output signal 137 or 139 is high, then a meta-stability condition is not detected, and the controller 110 determines whether or not to flip the second SAR bit (based on the SAR comparator output signal 135) and sets the third SAR bit to 1 for the next SAR phase.

Analogous processing continues SAR bit by SAR bit until the final SAR bit is resolved. If, at any SAR phase, a positive or negative meta-stability condition is detected, then the controller 110 takes the appropriate actions to correct for that meta-stability condition.

The embodiment shown in the figures employs a merged capacitor switching scheme in which the SAR LSB is evaluated in the last SAR phase. In this method, the first SAR bit (i.e., the MSB of the SAR bits) is resolved directly by comparing the input signal to an approximation signal generated based on the thermometer signal alone. In this embodiment, no prediction is performed. Before time t1, the coarse flash ADC output thermometer value is applied to the capacitive DAC. The capacitive DAC generates a residue voltage by time t1. At the first edge of SAR clock (SAR_CLK) at time t1, the SAR comparator detects whether this residue voltage is positive or negative and generates first MSB bit of SAR operation. The controller applies the new SAR comparator output to the capacitive DAC to generate the next SAR bit value (the second MSB bit) and a new residue voltage is applied to the SAR comparator to generate the next SAR bit value and another new residue voltage. This processing continues until the SAR LSB is resolved. At every edge of the SAR CLK, the comparators 522 and 622 of the meta-stability detectors 136 and 138 also trigger and determine whether the input to the SAR comparator 134 is out of range or not due to a metastable condition.

Figure 5:
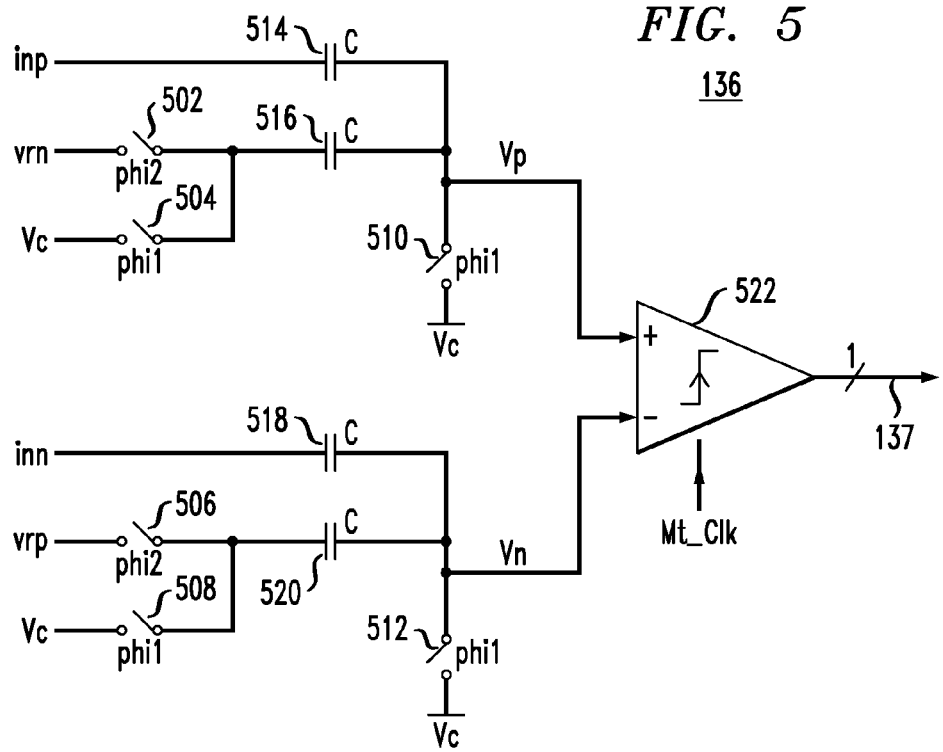
FIG. 5 is a schematic block diagram of the positive meta-stability detector of FIG. 1.

FIG. 5 is a schematic block diagram of the positive meta-stability detector 136 of FIG. 1. The PM detector 136 has six switches 502-512, four capacitors 514-520 having the same capacitance C, and a comparator 522. Switches 504, 508, 510, and 512 are controlled by control signal phi1, while switches 502 and 506 are controlled by control signal phi2. When the control signal phi1 is high, switches 504, 508, 510, and 512 are closed, and when the control signal phi1 is low, switches 504, 508, 510, and 512 are open. Similarly, when the control signal phi2 is high, switches 502 and 506 are closed, and when the control signal phi2 is low, switches 502 and 506 are open. Although not shown in the figures, the control signals phi1 and phi2 are generated by the controller 110 of FIG. 1.

As explained in further detail below in conjunction with the timing diagram of FIG. 4, during the coarse ADC stage of operation of the sub-ranging SAR ADC 100, the control signal phi1 is high, and the control signal phi2 is low. As such, while the sub-ranging SAR ADC 100 is generating the 30-bit thermometer value 123 and the corresponding 5-bit binary value 125, the switches 504, 508, 510, and 512 are closed, and the switches 502 and 506 are open. As such, during this time, the common-mode voltage Vc is applied to the left sides of the capacitors 516 and 520 through the closed switches 504 and 508, respectively, and also to the right sides of those same capacitors 516 and 520 through the closed switches 510 and 512, respectively. As such, during this time, the capacitors 516 and 520 will remain uncharged.

At the same time, the current positive approximation signal inp is applied to the left side of the capacitor 514, while the common-mode voltage Vc is applied to the right side of the capacitor 514 through the closed switch 510. As a result, the capacitor 514 will be charged based on the difference between the current positive approximation signal inp and the common-mode voltage Vc. Similarly, at the same time, the negative approximation signal inn is applied to the left side of the capacitor 518, while the common-mode voltage Vc is applied to the right side of the capacitor 518 through the closed switch 512. As a result, the capacitor 518 will be charged based on the difference between the current negative approximation signal inn and the common-mode voltage Vc.

At the end of the coarse ADC stage of operation of the sub-ranging SAR ADC 100, after the coarse ADC 120 has finished generating the 30-bit thermometer value 123 and the corresponding 5-bit binary value 125, the control signal phi1 is driven low, and the control signal phi2 is driven high. The control signal phi1 will remain low and the control signal phi2 will remain high throughout the fine SAR stage of operation of the sub-ranging SAR ADC 100. As such, while the sub-ranging SAR ADC 100 is successively generating the 6 bits of the binary SAR value, the switches 504, 508, 510, and 512 remain open, and the switches 502 and 506 remain closed.

As a result, during this time, the positive reference signal vrp is applied to the left side of the capacitor 516 through the closed switch 502, while the current positive approximation signal inp is applied to the left side of the capacitor 514. The positive reference voltage vrp is the positive component of a differential analog signal representing the largest expected change in the approximation signal 133 between successive SAR phases when there is no meta-stability condition in the coarse flash ADC 120. During this time, the voltage Vp at the positive input node of the comparator 522 will be driven to satisfy the condition of Equation (1) at the kth rising edge of Mt_Clk as follows:

$$(Vc-inp(t1))=(Vp(k)-vrn)+(Vp(k)-inp(k)), \quad (1)$$

where:
  inp(t1) is the positive approximation signal at the beginning of the SAR conversion stage (at time t1);
  inp(k) is the positive approximation signal at the kth rising edge of the Mt_Clk (at time t(k+1)); and
  Vp(k) is the voltage Vp at time t(k+1).
Solving Equation (1) for Vp(k) yields Equation (2) as follows:

$$Vp(k)=\tfrac{1}{2}*(Vc+vrn-inp(t1)+inp(k)). \quad (2)$$

Similarly, during this time, the negative reference signal vrn is applied to the left side of the capacitor 520 through the closed switch 506, while the current negative approximation signal inn is applied to the left side of the capacitor 518. The negative reference voltage vrn is the negative component of the differential analog signal representing the largest expected change in the approximation signal 133 between successive SAR phases when there is no meta-stability condition in the coarse flash ADC 120. During this time, the voltage Vn at the negative input node of the comparator 522 will be driven to satisfy the condition of Equation (3) at the kth rising edge of Mt_Clk as follows:

$$(Vc-inn(t1))=(Vn(k)-vrp)+(Vn(k)-inn(k)), \quad (3)$$

where:
  inn(t1) is the negative approximation signal at the beginning of the SAR conversion stage (at time t1);
  inn(k) is the positive approximation signal at the kth rising edge of the Mt_Clk (at time t(k+1)); and
  Vn(k) is the voltage Vn at time t(k+1).
Solving Equation (3) for Vn(k) yields Equation (4) as follows:

$$Vn(k)=\tfrac{1}{2}*(Vc+vrp-inn(t1)+inn(k)). \quad (4)$$

Comparator 522 compares the voltages Vp(k) and Vn(k). If the voltage Vp(k) is greater than the voltage Vn(k) (i.e., (Vp(k)−Vn(k))>0), then subtracting Equation (4) from Equation (2) yields Equation (5) as follows:

$$(inp(k)-inn(k))-(inp(t1)-inn(t1))>(vrp-vrn). \quad (5)$$

At every kth instance (i.e., at time t(k+1), the comparator 522 compares the difference between (i) the magnitude of the DAC output 133 at time t1 and (ii) the magnitude of the DAC output 133 at time t(k+1) to the threshold value (vrp−vrn), where the threshold value (vrp−vrn) is chosen to be (for example) 50% greater than the maximum possible DAC output jump based on the voltage increment represented by the MSB of the 6-bit binary SAR value. When there is no meta-stability condition, the DAC output jump represented by the left side of Equation (5) never exceeds the threshold value (vrp−vrn). However, under a positive meta-stability condition, the DAC output jump will be double the maximum possible jump and therefore will exceed the threshold value (vrp−vrn).

If the positive comparator input voltage Vp is greater than the negative comparator input voltage Vn, then the comparator 522 will generate a high value for the comparator output signal 137, thereby indicating the detection of a positive meta-stability condition in the coarse flash ADC 120. Otherwise, the comparator output signal 137 is low indicating that no positive meta-stability condition has been detected in the coarse flash ADC 120. Note that the comparator output signal 137 being low does not mean that there is no meta-stability condition in the coarse flash ADC 120; only that no meta-stability condition has been detected yet.

Figure 6:
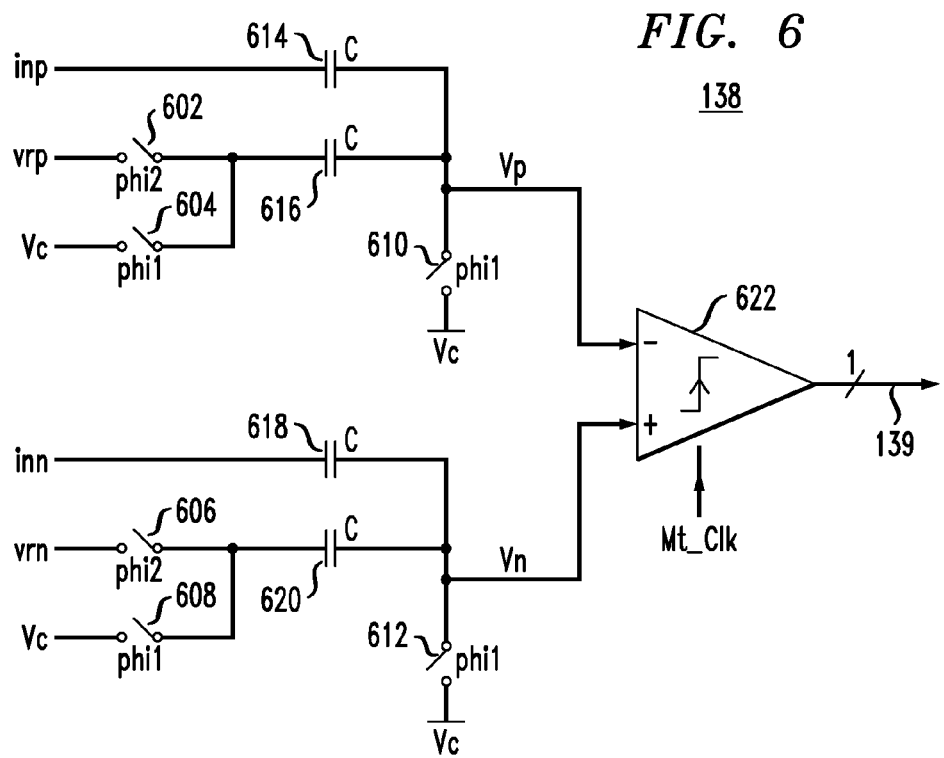
FIG. 6 is a schematic block diagram of the negative meta-stability detector of FIG. 1.

FIG. 6 is a schematic block diagram of the negative meta-stability detector 138 of FIG. 1. The NM detector 138 is analogous to the PM detector 136 of FIG. 5 with six switches 602-612, four capacitors 614-620 having the same capacitance C, and a comparator 622. The NM detector 138 is identical to the PM detector 136, except that the positive and negative reference voltages vrp and vrn are reversed, with the positive reference voltage vrp applied to the left side of the capacitor 620 through the switch 606 and the negative reference voltage vrn applied to the left side of the capacitor 616 through the switch 602. These differences mean that the NM detector 138 is configured to detect a negative meta-stability condition in the coarse flash ADC 120 instead of a positive meta-stability condition. As such, if the positive comparator input voltage Vp in FIG. 6 is less than the negative comparator input voltage Vn, then the comparator 622 will generate a high value for the comparator output signal 139 indicating the existence of a negative meta-stability condition in the coarse flash ADC 120. Otherwise, the comparator output signal 139 is low indicating that no negative meta-stability condition has been detected in the coarse flash ADC 120.

After the last successful SAR phase during which the SAR LSB is resolved, the controller 110 combines (by conventional padding and adding) (i) the (possibly corrected) five-bit MSB binary value based on the value 125 from the coarse flash ADC 120 and (ii) the final six-bit binary SAR value based on the bits sequentially resolved by the fine SAR ADC 130 to generate the 10-bit binary output signal 115.

In an example implementation of the 10-bit sub-ranging SAR ADC 100 of FIG. 1 having the 5-bit coarse flash ADC 120 and the 6-bit fine SAR ADC 130, the following parameters can have the following values:
  Vref+=1.0 volts;
  Vref−=0.5_volts;
  Vcm=0.75 volts; and
  Cu=15 femtofarads,
where the components Vin+ and Vin− of the analog input signal 101 can vary reciprocally with respect to the common-mode voltage (Vcm=0.75 volts) between 0.5 volts and 1.0 volts. For example, when Vin+ is 1.0 volts, Vin− will be 0.5 volts. And, when Vin+ is 0.8 volts, Vin− will be 0.7 volts. As mentioned before, the meta-stability threshold value (vrp−vrn) is based on the maximum possible DAC output jump, which is itself based on the voltage increment represented by the MSB of the 6-bit binary SAR value. For this example implementation, the maximum possible DAC output jump is Vr/32, where Vr=(Vref+−Vref−) or 0.5 volts. Under a coarse meta-stability condition, the DAC output jump can be Vr/16. In this case, the threshold value (vrp−vrn) can be selected to be between Vr/32 and Vr/16, such as 3*Vr/64 or 23.4375 mvolts. Suitable, corresponding values for vrp, vrn, and Vc can be selected to achieve proper bias conditions. Those skilled in the art will understand that the sub-ranging SAR ADC 100 may be implemented with other suitable parameter values.

Although the invention has been described in the context of the 10-bit sub-ranging SAR ADC 100 of FIG. 1 having the 4.5-bit coarse flash ADC 120 for the MSBs and the 6-bit SAR ADC 130 for the LSBs, in general, the invention can be implemented for any N-bit sub-ranging SAR ADC having an M.5-bit coarse flash ADC for the MSBs and an (N−M)-bit SAR ADC for the LSBs.

Although the invention has been described in the context of the sub-ranging SAR ADC 100 having a flash ADC as the coarse ADC 120 that generates the MSB bit values and a SAR ADC as the fine ADC 130 that generates the LSB bit values, the invention is not so limited. In other implementations, the coarse ADC can be other than a flash ADC such as a SAR ADC and/or the fine ADC can be other than a SAR ADC such as a pipeline ADC, where the coarse ADC generates a residue voltage that is applied to the fine pipeline ADC. In these other implementations, a coarse meta-stability condition can be detected by detecting a relatively large change in the output generated by the coarse ADC during the fine conversion stage.

In certain embodiments, the invention is an article of manufacture comprising a sub-ranging ADC that generates a digital output value corresponding to an analog input signal. The sub-ranging ADC comprises a coarse ADC, a fine ADC, and MTS detection circuitry. The coarse ADC generates bit values corresponding to MSBs of the digital output value. The fine ADC generates bit values corresponding to least-significant bits (LSBs) of the digital output value. The fine ADC generates successive analog approximation signals for the analog input signal. The MTS detection circuitry compares a current approximation signal to a previous approximation signal to detect a coarse-ADC MTS condition in the coarse ADC. A controller controls operations of the sub-ranging ADC to correct for a detected coarse-ADC MTS condition.

In some embodiments, the sub-ranging ADC is a sub-ranging SAR ADC, and the coarse ADC is a flash ADC comprising a thermometer ADC that generates a thermometer value for the input signal, and a thermometer-to-binary converter that converts the thermometer value into a coarse binary value corresponding to the MSBs of the digital output value. The fine ADC is a SAR ADC comprising a DAC that generates the successive analog approximation signals, and a SAR comparator that compares the current approximation signal to the input signal to resolve a current bit of the LSBs of the digital output signal.

In some embodiments, the DAC is a split-capacitor capacitive DAC configured to generate the current approximation signal based on the thermometer value and a current value for the LSBs of the digital output signal.

In some embodiments, the controller is configured to control the fine ADC to repeat resolution of a previously resolved bit of the LSBs in order to correct for the detected coarse-ADC MTS condition.

In some embodiments, the controller flips a bit generated by the coarse ADC in order to correct for the detected coarse-ADC MTS condition. In some embodiments, the MTS detection circuitry detects the coarse-ADC MTS condition if a magnitude of a difference between the current approximation signal and the previous approximation signal is greater than a specified threshold level.

In some embodiments, the MTS detection circuitry comprises a positive MTS detector configured to compare the current approximation signal to the previous approximation signal to detect a positive coarse-ADC MTS condition in the coarse ADC, and a negative MTS detector configured to compare the current approximation signal to the previous approximation signal to detect a negative coarse-ADC MTS condition in the coarse ADC.

In some embodiments, the positive MTS detector is configured to detect the positive coarse-ADC MTS condition if a difference between the current approximation signal and the previous approximation signal is greater than a specified positive threshold level; and the negative MTS detector is configured to detect the negative coarse-ADC MTS condition if a difference between the current approximation signal and the previous approximation signal is greater than a specified negative threshold level.

In some embodiments, the previous approximation signal is the approximation signal for the MSB of the LSB bits of the digital output signal.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding terminals, nodes, ports, or paths may be referred to by the same name and are interchangeable for purposes here. Unless explicitly stated otherwise, each numerical value and range should be interpreted as being approximate as if the word "about" or "approximately" preceded the value or range.

It will be understood that various changes in the details, materials, and arrangements of the parts which have been described and illustrated in order to explain embodiments of this invention may be made by those skilled in the art without departing from embodiments of the invention encompassed by the following claims.

In this specification, including the claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An article of manufacture comprising a sub-ranging analog-to-digital converter (ADC) for generating a digital output value corresponding to an analog input signal, the sub-ranging ADC comprising:
   a coarse ADC that generates bit values corresponding to most-significant bits (MSBs) of the digital output value;

a fine ADC that generates bit values corresponding to least-significant bits (LSBs) of the digital output value, wherein the fine ADC generates successive analog approximation signals for the analog input signal;

meta-stability (MTS) detection circuitry that compares a current approximation signal to a previous approximation signal to detect a coarse-ADC MTS condition in the coarse ADC; and a controller that controls operations of the sub-ranging ADC to correct for a detected coarse-ADC MTS condition.

2. The article of claim 1, wherein:

the sub-ranging ADC is a sub-ranging successive approximation register (SAR) ADC;

the coarse ADC is a flash ADC comprising:
 a thermometer ADC configured to generate a thermometer value for the input signal; and
 a thermometer-to-binary converter configured to convert the thermometer value into a coarse binary value corresponding to the MSBs of the digital output value; and the fine ADC is a SAR ADC comprising:
 a digital-to-analog converter (DAC) configured to generate the successive analog approximation signals; and
 a SAR comparator configured to compare the current approximation signal to the input signal to resolve a current bit of the LSBs of the digital output signal.

3. The article of claim 2, wherein the DAC is a split-capacitor capacitive DAC configured to generate the current approximation signal based on the thermometer value and a current value for the LSBs of the digital output signal.

4. The article of claim 1, wherein the controller is configured to control the fine ADC to repeat resolution of a previously resolved bit of the LSBs in order to correct for the detected coarse-ADC MTS condition.

5. The article of claim 1, wherein the controller is configured to flip a bit generated by the coarse ADC in order to correct for the detected coarse-ADC MTS condition.

6. The article of claim 1, wherein the MTS detection circuitry detects the coarse-ADC MTS condition if a magnitude of a difference between the current approximation signal and the previous approximation signal is greater than a specified threshold level.

7. The article of claim 1, wherein the MTS detection circuitry comprises:
 a positive MTS detector that compares the current approximation signal to the previous approximation signal to detect a positive coarse-ADC MTS condition in the coarse ADC; and
 a negative MTS detector that compares the current approximation signal to the previous approximation signal to detect a negative coarse-ADC MTS condition in the coarse ADC.

8. The article of claim 7, wherein:
the positive MTS detector detects the positive coarse-ADC MTS condition if a difference between the current approximation signal and the previous approximation signal is greater than a specified positive threshold level; and
the negative MTS detector detects the negative coarse-ADC MTS condition if a difference between the current approximation signal and the previous approximation signal is greater than a specified negative threshold level.

9. The article of claim 1, wherein the previous approximation signal is the approximation signal for the MSB of the LSB bits of the digital output signal.

10. The article of claim 1, wherein:

the sub-ranging ADC is a sub-ranging successive approximation register (SAR) ADC;

the coarse ADC is a flash ADC comprising:
 a thermometer ADC configured to generate a thermometer value for the input signal; and
 a thermometer-to-binary converter configured to convert the thermometer value into a coarse binary value corresponding to the MSBs of the digital output value;

the fine ADC is a SAR ADC comprising:
 a digital-to-analog converter (DAC) configured to generate the successive analog approximation signals; and
 a SAR comparator configured to compare the current approximation signal to the input signal to resolve a current bit of the LSBs of the digital output signal;

the DAC is a split-capacitor capacitive DAC configured to generate the current approximation signal based on the thermometer value and a current value for the LSBs of the digital output signal;

the controller is configured to control the fine ADC to repeat resolution of a previously resolved bit of the LSBs in order to correct for the detected coarse-ADC MTS condition;

the controller is configured to flip a bit generated by the coarse ADC in order to correct for the detected coarse-ADC MTS condition;

the MTS detection circuitry is configured to detect the coarse-ADC MTS condition if a magnitude of a difference between the current approximation signal and the previous approximation signal is greater than a specified threshold level;

the MTS detection circuitry comprises:
 a positive MTS detector configured to compare the current approximation signal to the previous approximation signal to detect a positive coarse-ADC MTS condition in the coarse ADC; and
 a negative MTS detector configured to compare the current approximation signal to the previous approximation signal to detect a negative coarse-ADC MTS condition in the coarse ADC;

the positive MTS detector is configured to detect the positive coarse-ADC MTS condition if a difference between the current approximation signal and the previous approximation signal is greater than a specified positive threshold level;

the negative MTS detector is configured to detect the negative coarse-ADC MTS condition if a difference between the current approximation signal and the previous approximation signal is greater than a specified negative threshold level; and the previous approximation signal is the approximation signal for the MSB of the LSB bits of the digital output signal.

* * * * *